United States Patent [19]

Goshima et al.

[11] 4,109,045
[45] Aug. 22, 1978

[54] INFORMATION RECORDING MEDIUM

[75] Inventors: Takeshi Goshima, Tokyo; Kiyonobu Endo, Yokohama, both of Japan

[73] Assignee: Canon Kabushiki Kaisha, Tokyo, Japan

[21] Appl. No.: 739,988

[22] Filed: Nov. 8, 1976

Related U.S. Application Data

[63] Continuation of Ser. No. 411,733, Nov. 1, 1973, abandoned.

[30] Foreign Application Priority Data

Nov. 6, 1972 [JP] Japan ................. 48-110943

[51] Int. Cl.² .................. H04N 5/76; H04N 5/84
[52] U.S. Cl. ......................... 428/212; 428/913; 428/457; 428/469; 428/539; 358/128; 358/130
[58] Field of Search ............... 346/135, 136, 137; 96/68, 69, 70, 71; 428/500, 483, 461, 457, 441, 212, 913, 469, 539; 156/8; 358/128, 130; 178/6.7 A, 6.6 R; 179/100.3 V, 100.4 C

[56] References Cited

U.S. PATENT DOCUMENTS

| 3,155,509 | 11/1964 | Roscow | 96/73 |
| 3,450,536 | 6/1969 | Wyckoff | 96/68 |
| 3,531,314 | 9/1970 | Kerr et al. | 96/68 |
| 3,647,463 | 3/1972 | Taber et al. | 96/68 |
| 3,761,264 | 9/1973 | Sterzer | 96/36.2 |
| 3,902,010 | 8/1975 | Goshima | 178/6.7 A |
| 3,982,943 | 9/1976 | Feng et al. | 96/68 |

*Primary Examiner*—Ralph S. Kendall
*Attorney, Agent, or Firm*—Fitzpatrick, Cella, Harper & Scinto

[57] ABSTRACT

A recording medium or video disk of this invention consists basically of a base, a plurality of layers formed on the base and made of a compound or compounds sensitive to radiation energy, and intermediate layers interposed between the adjacent radiation sensitive layers. Said radiation sensitive layers may have different sensitivities to radiation energy, and the intermediate layer should not chemically react with the photosensitive layers.

5 Claims, 7 Drawing Figures

INFORMATION RECORDING MEDIUM

This is a continuation, of application Ser. No. 411,733 filed Nov. 1, 1973, abandoned.

BACKGROUND OF THE INVENTION

In an apparatus such as a video disk recorder (VDR) of the type recording information of high frequencies such as television signals, raised and recessed areas are formed in response to information to be recorded on a recording medium along a scanning path of a recording device.

In reproduction, the scanning path formed by the recording device must be precisely traced by means of a detecting device. For this purpose it is preferable to form grooves or ridges in the recording medium so as to guide the detecting device and also to define the areas or portions in which information are recorded.

Therefore there may be proposed a method in which a beam of predetermined energy level is always focused upon a recording medium having a plurality of photosensitive layers laminated thereupon so as to form a guide or guides thereupon and the beam which is modulated in response to information to be recorded is superimposed upon the first mentioned beam so as to record information in areas defined by the guides. However, there arises a problem that the compounds of the adjacent photosensitive layers mix or chemically react with each other in the boundary to produce new compounds so that the photosensitive layers are seriously degraded. Furthermore the recording media are subjected to aging.

SUMMARY OF THE INVENTION

One of the objects of the present invention is therefore to provide a novel recording medium.

Another object of the present invention is to provide a novel recording medium in which guide portions for a detecting device may be formed in a simple manner.

A further object of the present invention is to provide a novel recording medium in which the adverse effects caused by the chemical reaction among the compounds in a plurality of layers sensitive to beam energy may be completely eliminated.

A still further object of the present invention is to provide a novel recording medium in which said beam energy or photosensitive layer or layers may be arbitrarily selected from a plurality of beam-sensitive or photosensitive layers.

DESCRIPTION OF THE PREFERRED EMBODIMENT

Figure 1A:
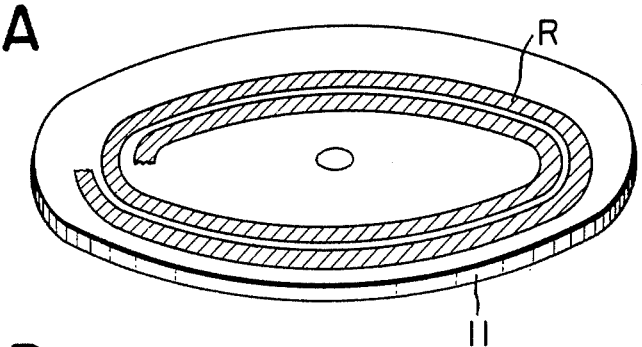
FIG. 1 A is a perspective view of a rotary recording medium with spiral recording paths or locuses.
FIG. 1B is a cross sectional view thereof.
Figure 1B:
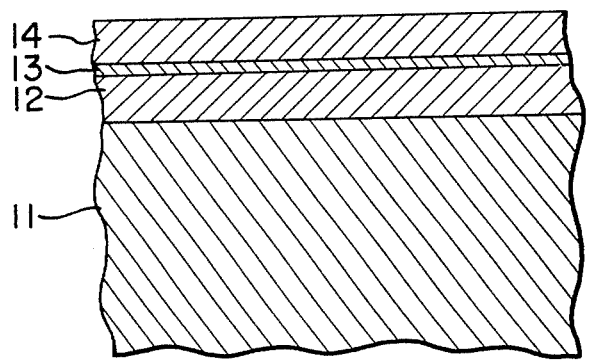

Referring to FIGS. 1A and 1B, a recording medium or video disk in accordance with the present invention comprises a base 11, a first photosensitive layer 12, an intermediate layer 13 and a second photosensitive layer 14 laminated in the order named. The first and second photosensitive layers 12 and 14 which have different sensitivities may be photoresists, photopolymers of gelatins of bichromate, thermoplastics or chalcogens. The intermediate layer 13 may be made of a photosensitive material or non-photosensitive material, but must be a material which will not chemically react with the photosensitive layers 12 and 14. Furthermore the intermediate layer 13 must has such a transmissivity to permit sufficient exposure of the underlying photosensitive layer 12.

Figure 2:
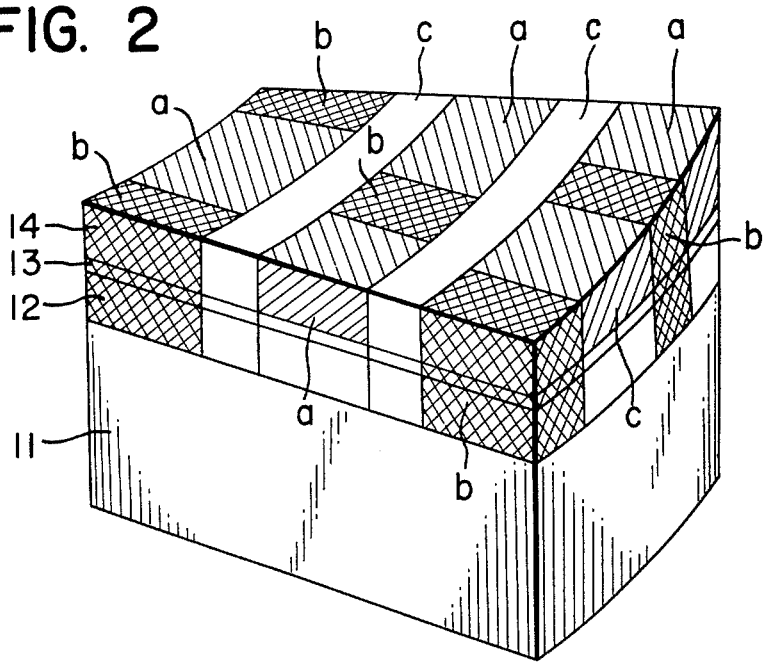
FIG. 2 is a fragmentary perspective view thereof exposed by the beam superposed with the beam modulated in response to information recorded.

The television or video signals are recorded upon the recording medium or disk generally designated by 15 by, for example, the method disclosed in "Information Recording Device" filed on Jan. 3, 1977, Ser. No. 756,538. That is, the laser beam with the energy sufficient to normally expose the second photosensitive layer 14, and the superposed laser beam whose intensity is varied or modulated in response to the signals to be recorded upon the first photosensitive layer 12, is scanned over the recording medium or disk radially thereof in such a manner that a spiral recording track may be formed as shown by R in FIG. 1A and the adjacent tracks may be separated from each other by an unexposed narrow strip-like portion; thus the recording medium or disk 15 is exposed as shown in FIG. 2. That is, parallel hatched areas $a$ denote the areas exposed by the bias beam whereas crisscrossed hatched areas denote the areas exposed by the beam whose intensity is varied or modulated in response to the signals to be recorded. White areas $c$ denote the areas which are not exposed by either beams.

When the intermediate layer 13 is made of a photosensitive material, it has a sensitivity intermediate those of the first and second photosensitive layers 12 and 14 so as to expose the first photosensitive layer 12 in response to the video signals to be recorded. That is, the energy reaching the first photosensitive layer 12 is given by $$E_1 = E_o \exp - (\sigma_1 d_1 + \sigma_2 d_2)$$

where $E_o$ = energy reaching the second photosensitive layer
14 to expose the same;
$\sigma_1, \sigma_2$ = coefficients of energy absorption of the intermediate and the second photosensitive layer 13 and 14, respectively; and
$d_1, d_2$ = thicknesses of the layers 13 and 14, respectively. It follows therefore that the first photosensitive layer 12 must not be exposed with the radiation energy less than $E_1$ given above. As a result, the second photosensitive layer 14 is exposed by the recording beam in a spiral form whereas the intermediate layer 13 and the first photosensitive layer 12 are exposed in response to the video signals superposed on the recording beam.

Figure 3:
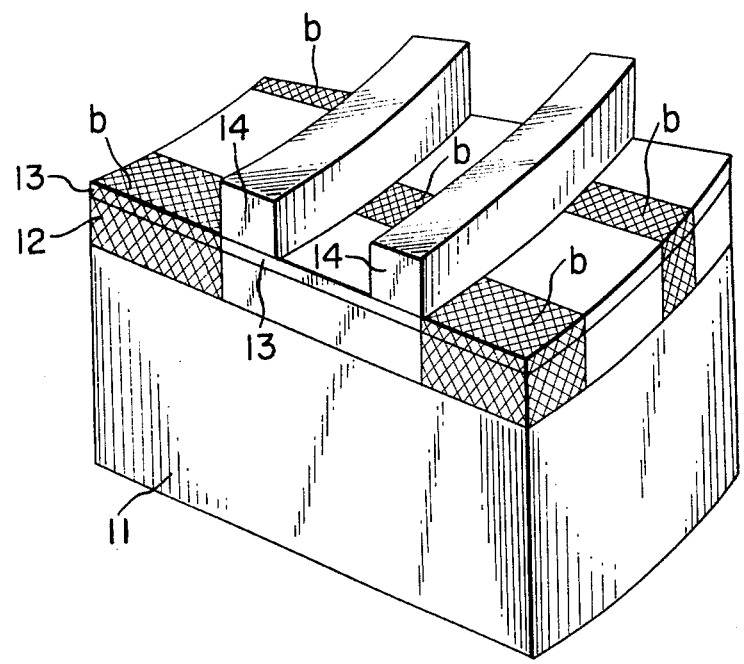
FIG. 3 is a fragmentary perspective view illustrating the recording medium with the upper photosensitive layer removed.
Figure 4:
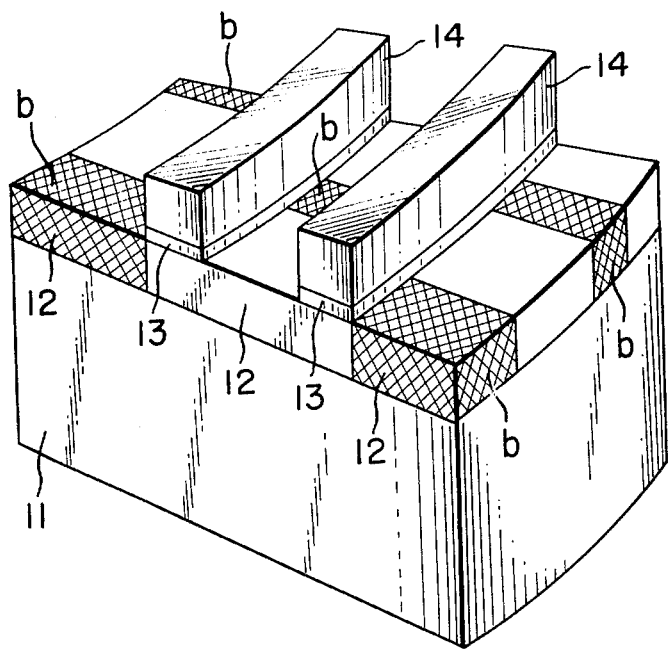
FIG. 4 is a fragmentary perspective view illustrating the recording medium with the intermediate layer removed.
Figure 5:
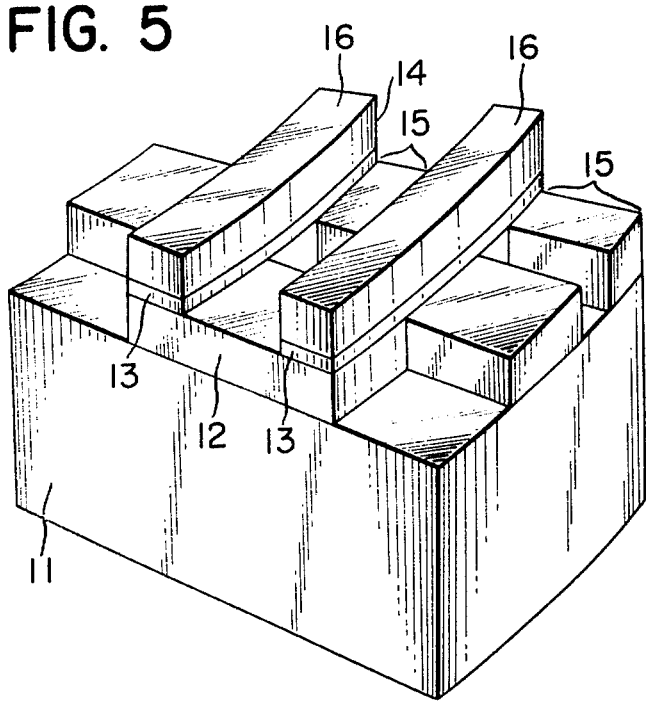
FIG. 5 is a fragmentary perspective view illustrating the recording medium with the exposed areas of the lower photosensitive layer removed.

Thereafter the recording medium or disk 15 undergoes the developing step so that the exposed areas $a$ and $b$ of the second photosensitive layer 14 are removed to expose the intermediate layer 13, but the unexposed areas c remains undissolved as shown in FIG. 3. When the second photosensitive layer 14 is made of a photoresist such as PHOTORESIST AZ-1350,303, a product of Shipley Inc. or MICROLINE 102, a product of GAF Inc., its corresponding etchant may be used. The etchant generally consists of caustic soda, sodium carbonate or sodium silicate. The next step is to remove the intermediate layer 13 by a suitable etchant regardless whether the layer 13 is made of a photosensitive material or not. When the intermediate layer 13 is made of a material which is adapted to be etched by the same etchant for the second photosensitive layer 14, the recording medium or disk 15 may be etched as shown in FIG. 4 by one step. Thereafter the exposed areas of the first photosensitive layer 12 are etched by a suitable manner as shown in FIG. 5.

Thus the recording medium or disk 15 having the video signals recorded thereupon is obtained. In FIG. 5, the lands and valleys 15 between tracking guides 16 for recording-playback head are the portions in the first photosensitive layer 12 where the video signals are digitally recorded. It is to be understood that the recording medium or disk 15 may be processed into the final form as shown in FIG. 5 by one step when an etchant used is of such a type that is capable of etching the exposed areas of all of the second, intermediate and first layers 14, 13 and 12.

The first and second photosensitive layers 12 and 14 may be made of a photoresist whereas the intermediate layer 13 may be made of a chalcogen. Alternatively, the first and second photosensitive layers 12 and 14 may be made of a chalcogen type photosensitive material whereas the intermediate layer 13 may be made of a photoresist. When the first or second photosensitive layer 12 or 14 may serve as an intermediate layer 13 the latter may be eliminated, but the selection of a thickness of the photosensitive layers 12 and 14 is limited, the provision of the intermediate layer in accordance with the present invention is very advantageous.

In addition to the materials described for the intermediate layer 13, may be used metals such as aluminum dissolved in alkali, chromium dissolved in hot sodium chlorate, silver dissolved in nitric acid, zinc dissolved in nitric acid, magnesium dissolved in nitric acid, semiconductors, macro-molecule compounds such as polyesters dissolved in sulfuric acid, or nonmetallic compounds such as glass ceramic dissolved in hydrofluoric acid and Nesa glass dissolved in a solution consisting of sodium chlorate and zinc powder. The first and second photosensitive layers may be made of photoresists, a mixture of a photoresist and a chalcogen or chalcogens, a chalcogen series compound, a mixture of chalcogen compounds with photoresists, thermoplastic (which functions not as a photosensitive material but as a beam-energy-sensitive material in combination with photoresists).

Referring back to FIG. 2, the intermediate layer 13 which has a thickness of the order of hundreds Å may be a non-photosensitive material. The thickness of the intermediate layer 13 must be so selected as to permit the exposure of the first photosensitive layer 12 so that the thickness must be varied depending upon the intensity of a light source used and a transmissivity of a material used. The processing of the intermediate layer 13 from FIG. 2 to FIG. 3 may be carried out in a manner substantially to that described hereinbefore.

Referring back to FIG. 3, the intermediate layer 13 which is made of aluminum may be etched by an etchant with a low pH, but the photosensitive layers 12 and 14 must be made of an alkali-resisting material or materials.

Figure 6:
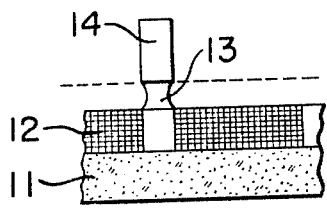
FIG. 6 is a cross sectional view of FIG. 5.

When the recording medium or disk 15 is processed in the manner described hereinbefore, the metallic intermediate layer 13 which is not exposed tends to be etched as shown in FIG. 6, which is generally called the side-etching. As a result there is a fear that the unexposed photosensitive area 13 tends to be separated from the intermediate layer 14. However this side-etching problem may be overcome by the plasma dry etching method which has been reported recently. That is, according to this method the plasma produced in the vacuum of the order of 0.5 Torr may etch a layer of a semiconductor such as silicon at a rate of 400 to 4,000 Å per minute, but the photoresist layer may be kept intact. Therefore this method is very advantageous when the photosensitive layers 12 and 14 are formed. (Further reference is made to ELECTRONICS, June 5, 1972).

After the intermediate layer 13 has been etched in the manner described above, the first photosensitive layer 12 is etched to remove the exposed portions as shown in FIG. 5. Thus the recording medium or disk 15 with the tracking guides may be provided.

In the instant embodiment the positive type photosensitive material or materials are used so that the exposed portions may be removed by an etchant or etchants, but the intermediate layer may be formed between the negative type photosensitive layers in which the unexposed portions are etched to be removed. In the latter case, the first photosensitive layer must have a sensitivity higher than that of the second photosensitive layer, and the light beam with a higher strength must scan the portions of the recording medium or disk which remain as the tracking guides so that the second as well as the first photosensitive layers may be exposed simultaneously. Thereafter the beam whose intensity is relatively low and is modulated in response to the video signals to be recorded must be used to scan only the first photosensitive layer.

The intermediate layer in accordance with the present invention is very advantageous not only when the light beam such as laser beam is used for recording but also when the electron beams are used. In the latter case, the first photoresistive layer may be made of a thermoplastic; the intermediate layer, by any material listed hereinbefore; and the second layer, by a photoresist. The thermoplastic layer is deformed in response to the intensities of the electron beams which in turn are varied in response to the information to be recorded. After recording the second photosensitive layer may be removed in a manner substantially similar to that described hereinbefore.

In the instant embodiment, the photosensitive layers have been described as consisting of two layers, but it is understood that a plurality of photosensitive layers may be formed.

We claim:
1. A recording medium which comprises:
   (a) a base;
   (b) a first layer disposed directly on said base, said first layer being selectively sensitive to a first irradiated light beam such that the exposed portions and the unexposed portions of said first layer have different solubilities in a given solvent to permit either the exposed or the unexposed portions to be removed;

(c) a second layer disposed above said first layer, said second layer being selectively sensitive to a second irradiated light beam such that the exposed portions and the unexposed portions of said second layer have different solubilities in a given solvent to permit either the exposed or unexposed portions to be removed and wherein said second layer is substantially transmissive at least with respect to the first irradiated light beam to permit exposure of said first layer by the first light beam; and (d) an intermediate layer interposed between said first and second layers to prevent direct contact of said first and second layers, said intermediate layer being chemically non-reactive with and incapable of diffusing into such first and second layers, wherein said intermediate layer is substantially transmissive at least with respect to the fist irradiated light beam to permit exposure of said first layer to the first irradiated light beam which passes through said second layer and is sensitive to one of the irradiated beams, the sensitivity of said intermediate layer being at a level between that of said first layer and that of said second layer.

2. A recording medium according to claim 1, wherein the sensitivity of said intermediate layer to the one beam is such that the exposed portions and the unexposed portions have different solubilities in a given solvent to permit either the exposed portions or the unexposed portions of said intermediate layer to be removed.

3. A recorded medium formed by subjecting the recording medium of claim 1 to the first irradiated light beam which comprises an information beam and the second irradiated light beam which comprises a bias beam.

4. A recording medium which comprises:
(a) a base;
(b) a first layer disposed directly of said base, said first layer being selectively sensitive to a first irradiated light beam so as to be deformed thereby;
(c) a second layer disposed above said first layer, said second layer being selectively sensitive to a second irradiated light beam such that the exposed portions and the unexposed portions of said second layer have different solubilities in a given solvent to permit either the exposed or the unexposed portions of said second layer to be removed by application of a dissolving liquid and wherein said second layer is substantially transmissive at least with respect to the first irradiated light beam to permit exposure of said first layer by the first irradiated light beam; and
(d) an intermediate layer interposed between said first and second layer to prevent direct contact of said first and second layers, said intermediate layer being chemically non-reactive with and incapable of dissolving into said first and second layers, wherein said intermediate layer is substantially transmissive at least with respect to said first irradiated light beam to permit exposure of said first layer by the first irradiated light beam which passes through said second layer.

5. A recording medium according to claim 4, wherein the intermediate layer is sensitive to either the first or the second irradiated light beam and wherein the sensitivity of said intermediate layer is at a level between that of said first and second layers.

* * * * *